US006877147B2

(12) United States Patent
Kidd et al.

(10) Patent No.: US 6,877,147 B2
(45) Date of Patent: Apr. 5, 2005

(54) TECHNIQUE TO ASSESS TIMING DELAY BY USE OF LAYOUT QUALITY ANALYZER COMPARISON

(75) Inventors: David A. Kidd, San Jose, CA (US); Nathan D. Dias, Sunnyvale, CA (US); Matthew J. Page, San Jose, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/200,365

(22) Filed: Jul. 22, 2002

(65) Prior Publication Data

US 2004/0015805 A1 Jan. 22, 2004

(51) Int. Cl.⁷ .............................................. G06F 17/50
(52) U.S. Cl. .............................. 716/12; 176/6; 176/11; 176/13; 176/14; 713/401
(58) Field of Search ................................ 716/6, 11, 12, 716/13, 14, 2, 5, 7; 713/401; 703/15

(56) References Cited

U.S. PATENT DOCUMENTS

| | | | | |
|---|---|---|---|---|
| 5,805,861 A | * | 9/1998 | Gilbert et al. ................. | 703/15 |
| 6,751,744 B1 | * | 6/2004 | Allen et al. ................... | 713/401 |
| 2002/0049957 A1 | * | 4/2002 | Hosono et al. ................ | 716/5 |
| 2003/0018947 A1 | * | 1/2003 | Teig et al. ..................... | 716/7 |

OTHER PUBLICATIONS

"Rectilinear Full Steiner Tree Generation," Martin Zachariasen, Technical Report DIKU–TR–97/29, Dept. of Computer Science, Dec. 1997, 36 pages.
"Exact Algorithms for Plane Steiner Tree Problems: A Computational Study," Warme, et al., Technical Report DIKU–TR–98/11, Dept. of Computer Science, Apr. 1998, 33 pages.
"A New Exact Algorithm for Rectilinear Steiner Trees," David M. Warme, Apr. 27, 1997, 42 pages.
"Rectilinear Full Steiner Tree Generation," Martin Zachariasen, Technical Report DIKU–TR–97/29, Dept. of Computer Science, Dec. 1997, 36 pages.
"Large Euclidean Steiner Minimum Trees in an Hour," Winer and Zachariasen, Dept. of Computer Schience, University of Copenhagen, Oct. 4, 1996, 28 pages.
"Spanning Trees in Hypergraphs with Applications to Steiner Trees," David M. Warme, A Dissertation Presented to the Faculty of the School of Engineering and Applied Science–University of Virginia, May 1996, 122 pages.
"GeoSteiner, Software for Computing Steiner Trees," (http://www.diku.dk/geosteiner/) Mar. 20, 2001, 2 pages.
"Low–Degree Minimum Spanning Trees," Robins and Salowe, Dept. of Computer Science, University of VA, Feb. 11, 1999, 19 pages.
"ARIES: A rearrangeable Inexpensive Edge–Based On–line Steiner Algorithm," Bauer and Varma, Computer Engineering Dept., University of CA, Aug. 10, 1995, 37 pages.

(Continued)

*Primary Examiner*—Thuan Do
(74) *Attorney, Agent, or Firm*—Garlick Harrison & Markison LLP

(57) ABSTRACT

In one embodiment, a computer readable medium comprises at least first instructions and second instructions. The first instructions, when executed, compute a first plurality of routes. Each route of the first plurality of routes corresponds to a respective net of a plurality of nets in an integrated circuit layout, and represents a theoretically optimal route of the respective net according to a graph theory based algorithm. The second instructions, when executed, compare each of the first plurality of routes to a corresponding route of a current plurality of routes, each of the current plurality of routes corresponding to the respective net of the plurality of nets and currently existing in the integrated circuit layout. A method is also contemplated.

7 Claims, 6 Drawing Sheets

OTHER PUBLICATIONS

"Interconnect Layout Optimization by Simultaneous Steiner Tree Construction and Buffer Insertion," Okamoto and Cong, Dept. of Computer Science, University of CA, 1996, 6 pages.

"Preferred Direction Steiner Trees," Yildiz and Madden, State University of NY at Binghamton, Computer Science Dept., 2001, 6 pages.

"OR–Notes," J.E. Beasley, printed from web site on May 30k, 2002, 22 pages.

"Prim's Algorithm," National Institute of Standards and Technology, Sep. 30, 1999, 1 page.

"Kruskal's Algorithm," National Institute of Standards and Technology, Feb. 4, 2002, 1 page.

* cited by examiner

US 6,877,147 B2

TECHNIQUE TO ASSESS TIMING DELAY BY USE OF LAYOUT QUALITY ANALYZER COMPARISON

BACKGROUND OF THE INVENTION

1. Field of the Invention

This invention is related to the field of integrated circuit design tool software and, more particularly, to design tools for layout processing.

2. Description of the Related Art

The clock frequencies at which integrated circuits are designed to operate continue to increase over time. As a result, wire delay (the delay in propagating signals between the circuits in the integrated circuit) is increasingly an important factor in whether or not the clock frequency goals of the integrated circuit can be met.

In a typical design flow, the integrated circuit design is reduced to one or more netlists. Typically, the integrated circuit is divided, at a high level, into various blocks of functionality, each of which may be reduced to one or more netlists that, when realized as circuits, provide the functionality. Each netlist includes: (i) a list of predesigned circuits (often referred to as cells) which perform identified functions; and (ii) an identification of the interconnection between the cells, typically by using the same signal name on the output of one cell and the inputs of one or more other cells to which that output is connected. The predesigned circuits may include standard cells which perform standard logic/data flow functions (e.g. AND, OR, NAND, more complex logic functions, registers, multiplexors, etc.) which may be used throughout the integrated circuit design and/or custom circuits designed specifically for use in the circuit represented by the netlist.

The netlists are then processed with a layout tool to produce a physical layout of the integrated circuit. Each cell is placed on the layout, and nets are introduced into the layout to connect the inputs and outputs of the cells as specified in the netlist. In many cases, the layout tool may automatically generate the routing of the nets in the layout.

Due to a variety of factors (including limited wiring space, limitations in the algorithms used to automatically generate the routing, etc.), one or more nets may be routed in a less than optimum fashion. The added length of wire corresponding to the net may contribute to the delay in the circuit path which includes the net, and may cause the path to exceed the available time for evaluation. Detecting the sub-optimum routing is typically performed by engineers responsible for the integrated circuit design, by visually inspecting graphical representations of the layout and attempting to locate nets which can have their routing shortened.

SUMMARY OF THE INVENTION

In one embodiment, a computer readable medium comprises at least first instructions and second instructions. The first instructions, when executed, compute a first plurality of routes. Each route of the first plurality of routes corresponds to a respective net of a plurality of nets in an integrated circuit layout, and represents a theoretically optimal route of the respective net according to a graph theory based algorithm. The second instructions, when executed, compare each of the first plurality of routes to a corresponding route of a current plurality of routes, each of the current plurality of routes corresponding to the respective net of the plurality of nets and currently existing in the integrated circuit layout. A method is also contemplated.

The theoretically optimal route may be compared to the current route based on any attribute of the routes (e.g. total length, length between any two terminals, total capacitance, total resistance, etc.). Nets which have the greatest deviation between the theoretically optimal route and the current route may be identified, and the designer may focus on those nets for possible rerouting (e.g. manual routing).

BRIEF DESCRIPTION OF THE DRAWINGS

The following detailed description makes reference to the accompanying drawings, which are now briefly described.

Figure 1:
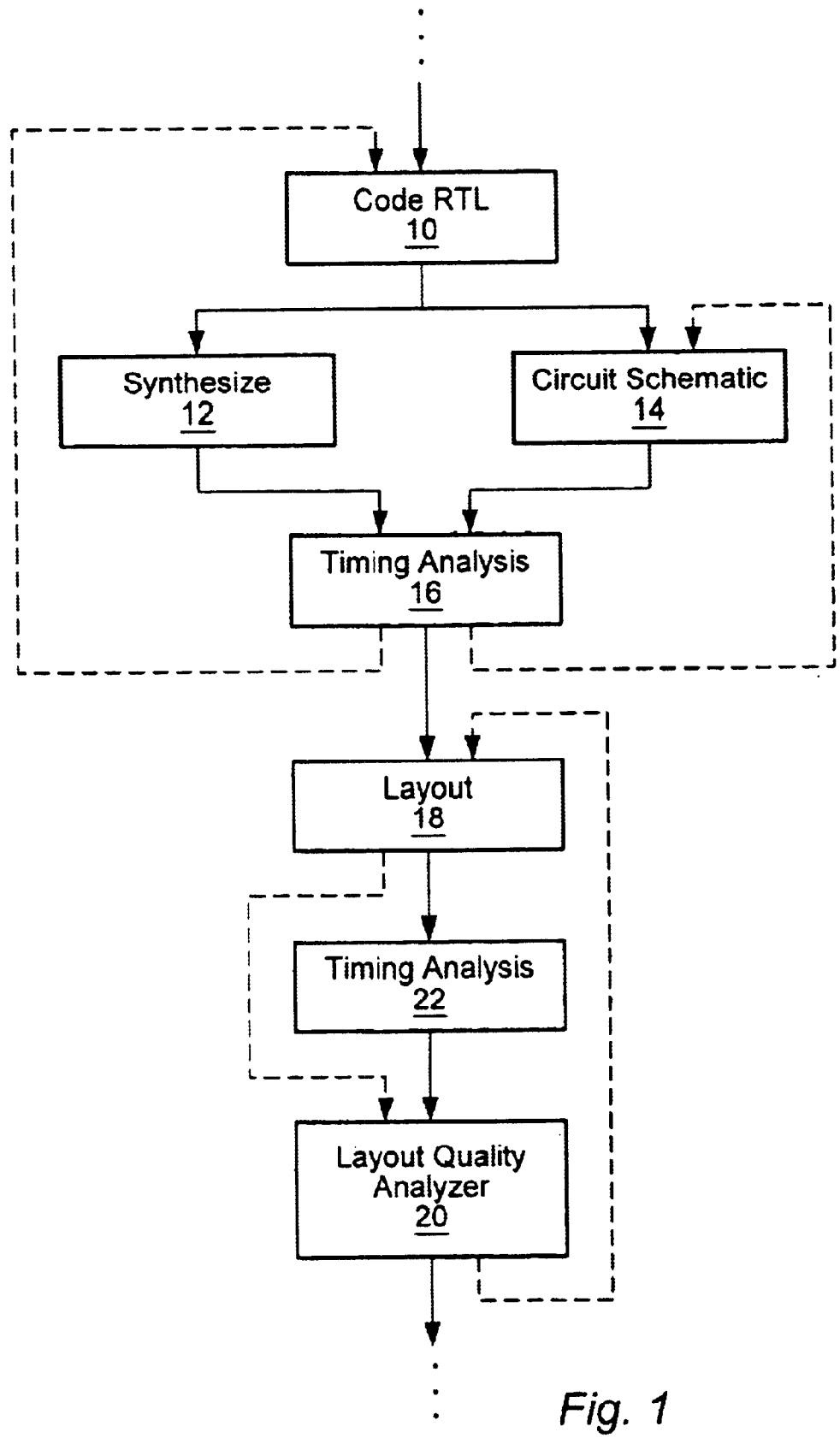
FIG. 1 is a block diagram illustrating one embodiment of a design flow including a layout quality analyzer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram illustrating one embodiment of a portion of a design flow is shown. Other embodiments are possible and contemplated.

Once the integrated circuit design has been divided into one or more blocks of functionality (more briefly referred to herein as blocks), the designer may code a register-transfer level (RTL) description of each block (reference numeral 10). Any hardware design language (HDL) may be used as the language for the RTL description (e.g. VHDL, Verilog, etc.). The RTL description may comprise one or more files per block, as desired.

The designer may choose to use a synthesis tool to synthesize the RTL description to a netlist (reference numeral 12). The synthesis tool takes the RTL description and a library of cells (predesigned circuits which have one or more inputs and produce one or more outputs as a specified function of one or more inputs) and generates a netlist of cells, linked together in such a way as to provide the functionality described in the RTL description. On the other hand, the designer may choose to design the circuits manually, using a circuit schematic/schematic capture tool (reference numeral 14). The designer may use a combination of circuit schematic design and synthesis for a given block.

The resulting netlists and schematic capture data may be provided to a timing analysis tool to estimate the timing of the design (i.e. to estimate whether or not the design will meet timing requirements for the integrated circuit to operate at a desired clock frequency) (reference numeral 16). Based on the timing results, the designer may modify the RTL description and/or the circuit schematics to improve the timing (illustrated in FIG. 1 with the dotted lines from the timing analysis (reference numeral 16) to the RTL coding (reference numeral 10) and the circuit schematics (reference numeral 14)). At the point illustrated by reference numeral 16, delay from the nets interconnecting the cells and other circuitry may be estimated (since the layout has not yet been performed) rather than extracted.

At some point, the estimated timing calculated at reference numeral 16 may be near the timing goals for the integrated circuit, and the layout of the netlists may be performed (reference numeral 18). Alternatively, layout work may start in parallel with timing analysis, or may be performed before any timing analysis is performed, as desired. Generally, the layout includes placing the cells called out in the netlist into physical positions within the integrated circuit layout, and routing the nets which interconnect the cells using the wiring layers of the integrated circuit layout. The circuit schematics produced using the circuit schematic tools may already be laid out within the circuit, but may be placed within the overall layout and the inputs and outputs of the circuit may be connected to nets, similar to the cells.

The layout tools (e.g. the Virtuoso XL tools from Cadence Design Systems, Inc.; etc.) generally attempt to place the cells and generate routes for the nets interconnecting the cells as efficiently as possible. In other cases, manual placement and routing may be performed. In either the manual case or the automated case, one or more nets may be routed in a somewhat inefficient fashion. There may be wiring congestion in certain areas of the layout, and the layout tools may route a net around that congestion, leading to a longer route for that net than may be otherwise possible. A longer route generally leads to a longer delay attributed to that net, and may contribute to timing problems in circuit paths which include that net.

A layout quality analyzer tool (reference numeral 22) may be executed in order to aid the designer in detecting nets having routes which may be improved. As used herein, a "net" may comprise a logical interconnection of terminals on two or more cells/custom circuits. The route for a given net may generally comprise the wire (on the various metal layers of the integrated circuit) used to connect a set of terminals in the layout. The terminals may include the input and output terminals of the cells to which that net is connected, where the cells have been placed at defined locations within the layout.

The route may be viewed as a connection of a set of points in a plane. For example, the points may include the terminals mentioned above. In graph theory, there are a variety of algorithms for calculating a theoretically optimal connection of a set of points in a plane. The connection may be theoretically optimal if the connection is the lowest cost connection of the possible connections. The cost may be defined in any desired fashion. For example, the cost may be the total length of the connection (i.e. a longer connection may be a higher cost connection than a shorter connection), and thus the theoretically optimal connection would be the shortest total length that connects the points. As another alternative, the cost may be the longest connection between any two points, and thus the theoretically optimal connection would be the connection which generates the shortest connection between each pair of points. Any cost function may be defined.

As mentioned above, many algorithms in graph theory may exist for calculating theoretically optimal connections. A popular algorithm which may be applied to routing in a layout is the Steiner algorithm, and that algorithm is used as an example of the layout quality analyzer herein. The Steiner algorithm attempts to compute a minimum weight tree which connects the terminals and one or more additional points (referred to as Steiner vertices). However, any graph theory based algorithm may be used in other embodiments. For example, Kruskal's algorithm or Prim's algorithm may be used. In Kruskal's algorithm, a set of partial minimum spanning trees are maintained and the algorithm repeatedly adds the shortest edge in the graph whose vertices are in different partial minimum spanning trees. In Prim's algorithm, a partial minimum spanning tree is repeatedly added to by connected the nearest vertex that is not already in the partial minimum spanning tree.

The layout quality analyzer may use the Steiner algorithm to generate a theoretically optimal route (the Steiner route) for each net in the layout, and then may compare the Steiner route to the current route (extracted from the layout). The comparison may identify one or more nets for which the current route exceeds the corresponding Steiner route, as well as the amount by which the current route exceeds the Steiner route. In this fashion, the designer may rapidly identify nets for possible manual routing to improve the route. The manual routing may not result in the theoretically optimal route, but an improved route may be generated, which may reduce timing issues that may be created by the current route. The dotted line from the layout quality analyzer (reference numeral 20) to the layout (reference numeral 18) may represent the designer returning to the layout tool to perform manual routing of one or more nets.

The timing analysis tool may be executed again prior to performing the layout quality analyzer (reference numeral 22), using wire delays for the nets extracted from the integrated circuit layout. The timing information may be used by the layout quality analyzer to select nets to be identified to the designer (e.g. the layout quality analyzer may identify nets that have a timing issue and for which the current route exceeds the Steiner route). In other embodiments, the layout quality analyzer may not attempt to use timing information in the identification of nets and thus the timing analysis at reference numeral 22 may be performed in parallel (illustrated by the dotted line from the layout, reference numeral 18, to the layout quality analyzer) or subsequent to layout quality analysis and manual routing efforts.

Subsequent to layout quality analysis, the design flow may continue toward fabricating the integrated circuit (not shown).

It is noted that, in one embodiment, the layout quality analyzer may be launched automatically from the layout tool, if desired.

Figure 2:
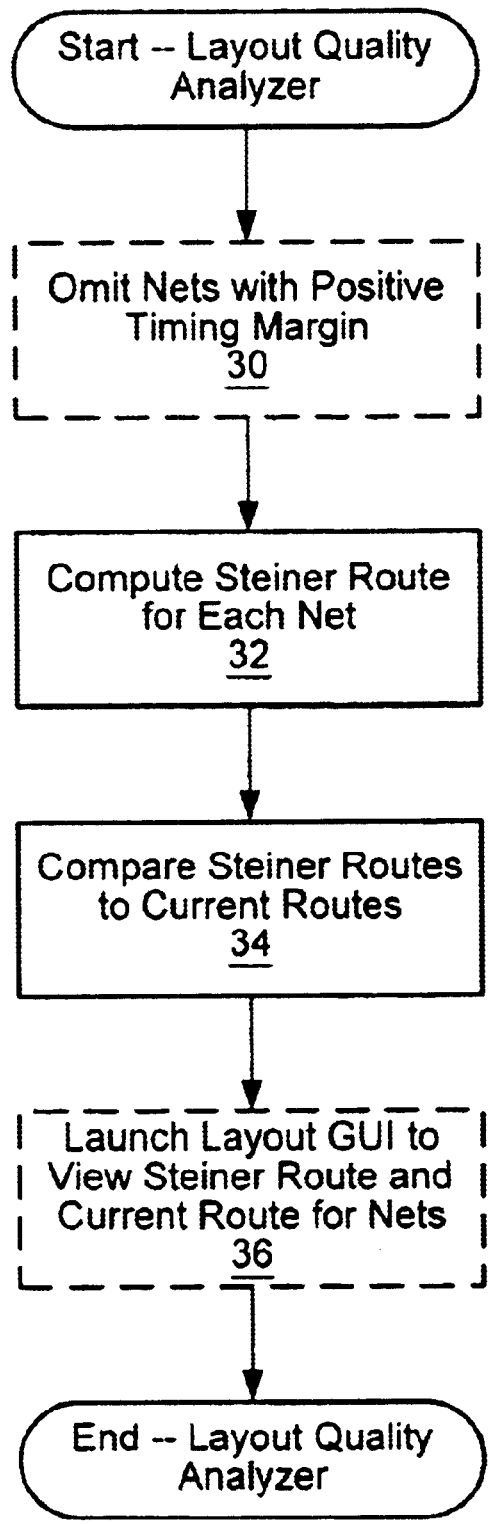
FIG. 2 is a flowchart illustrating one embodiment of the layout quality analyzer shown in FIG. 1.
Figure 3:
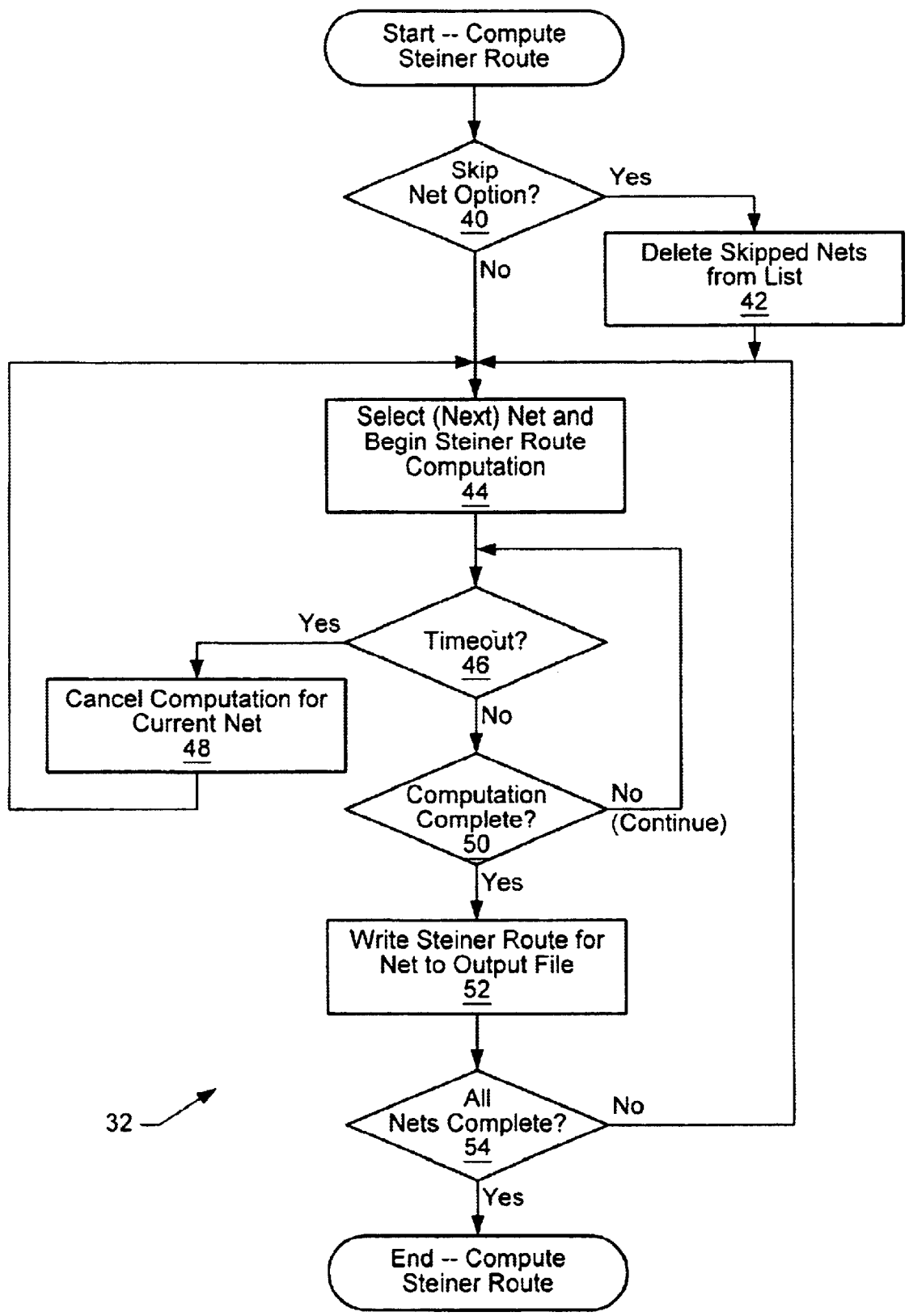
FIG. 3 is a flowchart illustrating one embodiment of computing Steiner routes for each net.
Figure 4:
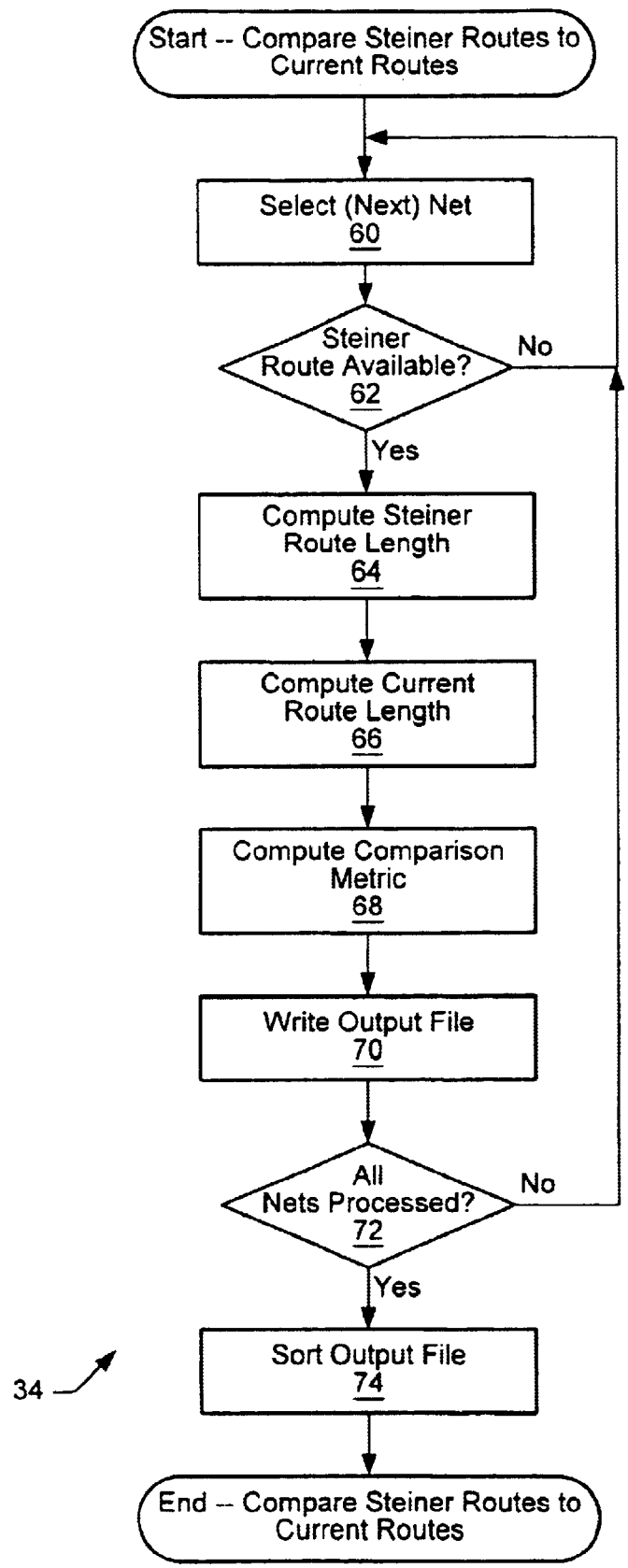
FIG. 4 is a flowchart illustrating one embodiment of comparing Steiner routes to current routes from the layout.

FIGS. 2–4 are flowcharts illustrating operation of various embodiments of the layout quality analyzer or portions thereof. The layout quality analyzer comprises software (i.e. instructions). The instructions, when executed, perform the operations shown in FIGS. 2–4. The instructions may be machine level instructions executed by a processor in a computer system. Alternatively, the instructions may be higher level instructions (e.g. shell scripts, interpretive language instructions, etc.) which are executed by software executing on the processor.

FIG. 2 is a flowchart illustrating operation of one embodiment of the layout quality analyzer. Other embodiments are possible and contemplated.

The layout quality analyzer may optionally omit nets in the layout which have a positive timing margin (block 30). A net has a positive timing margin if the timing analysis tool calculates that the net evaluates before it is required in order to meet the clock frequency goals of the integrated circuit. The margin is the amount of time that the net evaluates prior to it being required. A net may also have a positive timing margin if the timing analysis tool calculates that the net does not re-evaluate before a minimum valid time elapses (i.e. that the net remains stable after evaluation for at least the minimum valid time). In this case, the margin may be the amount of time that the net exceeds the minimum valid time before a re-evaluation may occur. Since these nets are already meeting timing, it may be desirable to omit them from consideration for rerouting. Block 30 is an optional portion of the layout quality analyzer, and other embodiments may omit the block. In other embodiments, nets having a route less than a certain length may be omitted.

The layout quality analyzer may compute a Steiner route for each net (or each remaining net, if nets have been omitted in block 30) (block 32). The Steiner route may be computed based on a variety of cost functions. For example, the total length cost function may be used, or the longest length between any two points cost function may be used. In some embodiments, total capacitance or total resistance measurements may be used to compare routes. In such embodiments, a Steiner route may be calculated for each net and then total capacitance and/or total resistance may be calculated for that route. Capacitance and resistance may be proportional to the length of the route, the wire width along the route, the wire thickness along the route, and the spacing of adjacent wires along the route. Any model for calculating resistance and/or capacitance of a route may be used.

The layout quality analyzer then compares the Steiner route for each net to the current route for that net (block 34). The comparison may be performed to identify those nets that have the greatest deviation of the current route from the Steiner route for that net. In one implementation, the layout quality analyzer may sort a list of the nets in the layout based on a metric representing the difference, for each net, between the current route and the Steiner route for that net. In this manner, the greatest deviation may be at the top or the bottom of the list. In another implementation, the layout quality analyzer may only output the nets for which the metric exceeds a threshold to identify the nets having the greatest deviation.

In one implementation, the layout quality analyzer may launch a layout graphical user interface (GUI) which permits the viewing the Steiner route and the current route of each net (block 36). For example, the corresponding routes may be presented side-by-side, vertically, or overlaid (e.g. with different colors for the Steiner route and the current route). Presenting the routes graphically may permit the designer to more readily visualize the routes that may be selected for manual routing. Additionally, in one implementation, the routes may be displayed in various colors based on the timing margin of the nets. For example, nets with the worst (most negative) timing margin may be displayed in red, nets with less negative timing margin may be displayed in yellow, and nets with positive timing margin may be displayed in green. In still other embodiments, a timing GUI may be launched to display the nets with timing information provided as well. In such a GUI, the above color schemes may be used to indicate which nets have the greatest deviation between the Steiner route and the current route. Block 36 is optional, and other embodiments may omit block 36.

Turning next to FIG. 3, a flowchart illustrating operation of one embodiment of computing a Steiner route (block 32 in FIG. 2) is shown. Other embodiments are possible and contemplated.

In the embodiment illustrated in FIG. 3, certain options which may be passed to the layout quality analyzer are used. In particular, a list of nets to be skipped and a timeout are used. Other embodiments may not support one or both of these options, if desired. The list of nets to be skipped may be included if one or more nets are found to take a long time in the Steiner computation, for example, to skip the one or more nets and thus may speed the overall Steiner computation time. The timeout value may be used to prevent the computation of a particular route from taking more than a certain amount of time (at which point that net is automatically skipped).

If the skip net option is being used (decision block 40), the skipped nets (provided to the layout quality analyzer as a list) may be deleted from the list of nets to be processed (which may be extracted from the layout) prior to computing the Steiner routes for the list of nets (block 42).

The first net (or next net, on subsequent iterations) is selected, and the layout quality analyzer begins computation (block 44). Blocks 46, 48, and 50 represent the operation of the optional timeout. The timeout may actually be implemented as a timed interruption which is set to the timeout value when the computation of the route begins and is cleared when the computation completes, and which automatically interrupts the execution of the computation if the timeout expires prior to completing the computation. If the timeout occurs (decision block 46), the layout quality analyzer cancels computation for the current net (block 48) and returns to block 44 to select the next net for computation. If the timeout does not occur and the computation is not complete (decision block 50), the computation continues. When the computation is complete, the layout quality analyzer may write the Steiner route to an output file (block 52), and select the next net if each net has not yet had Steiner computation performed for it (decision block 54). Alternatively, the Steiner routes may be retained in memory until the Steiner computation completes for each net, and the file may be written with the Steiner routes for each net at that time. In yet another alternative the Steiner routes may be retained in memory for the comparison process, and may be written to the output file after the comparison occurs (or not written to an output file at all, if desired).

It is noted that, while the above embodiment illustrates a skip net option for indicating nets to be skipped, it is also contemplated that a list of nets to be processed may be provided. In such a case, only the nets provided in the list may be processed (and other nets in the layout may be ignored).

As mentioned above, the Steiner algorithm may be based on the length of the routes for each net. In other embodiments, the total capacitance or total resistance of a route may be used as the basis for comparing Steiner and current routes. In such embodiments, the resistance and capacitance per micron may be supplied as parameters to the layout quality analyzer (which may employ defaults if the parameters are not supplied). The resistance and capacitance may be supplied separately for both the horizontal and vertical directions. Additionally, another parameter may be specified to use a simpler model in which the same resistance and capacitance per micron are used for each wire and each direction. Using any desired model, the total resistance or total capacitance of the route may be computed.

Turning next to FIG. 4, a flowchart is shown illustrating operation of one embodiment of comparing Steiner routes to current routes (block 34 in FIG. 2). Other embodiments are possible and contemplated.

The layout quality analyzer selects the first net (or the next net, in subsequent iterations) (block 60). The layout quality analyzer may check to see if there is a Steiner route available for the selected net (decision block 62). If no Steiner route is available, the layout quality analyzer may select the next net. No Steiner route may be available, for example, if the net was skipped (e.g. either due to its inclusion in the skip list supplied by the designer or due to a time out) or was omitted (e.g. for having positive phase margin).

If the Steiner route is available, the layout quality analyzer calculates the length of the Steiner route (block 64), calculates the length of the current route (block 66), and computes a comparison metric for the net which indicates the difference between the Steiner length and the current length (block 68). Generally, the comparison may be made based on any attribute of the routes (e.g. length, capacitance, resistance, etc.), as mentioned above.

The comparison metric may be any representation of the difference between the attributes of the Steiner route and the current route. For example, the comparison metric may be the ratio of the current route length to the Steiner route length, the percentage by which the current route length exceeds the Steiner route length, or the difference of the Steiner route length from the current route length. Any of the above metrics may be computed for capacitance or resistance as well.

The layout quality analyzer writes the net name, Steiner length, current length, and comparison metric (or a subset of the foregoing) to an output file (block 70). Alternatively, the comparison metrics may remain in memory until each net has been processed, and the metrics may be written to the output file together. In this embodiment, after each net has been processed (decision block 72), the layout quality analyzer sorts the output (e.g. according to the performance metric) (block 74). In this fashion, the nets to be examined for manual routing may be grouped at one end of the file (top or bottom) and the remaining nets may be ignored by the designer. The comparison metrics may be retained in memory and sorted in memory, then written to the output file in sorted order.

Figure 5:
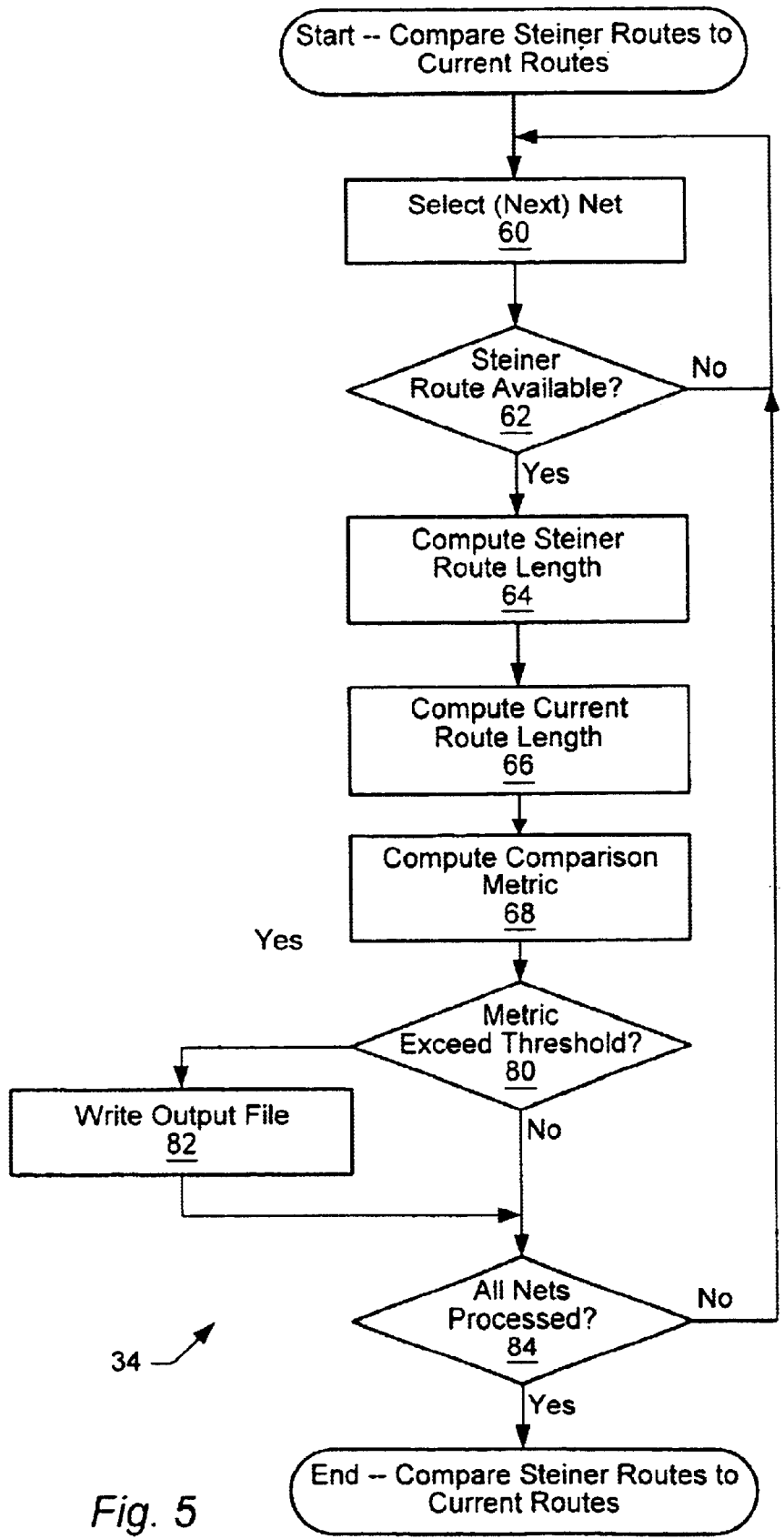
FIG. 5 is a flowchart illustrating a second embodiment of comparing Steiner routes to current routes from the layout.

FIG. 5 illustrates a second embodiment of comparing Steiner routes to current routes (block 34 in FIG. 2). Other embodiments are possible and contemplated.

Similar to the embodiment of FIG. 4, the embodiment of FIG. 5 may select each net in turn, determine if a Steiner route is available, and compute the Steiner length, the current length, and the comparison metric for that net if the Steiner route is available (blocks 60, 62, 64, 66, and 68). However, in this embodiment, the layout quality analyzer may determine if the comparison metric exceeds a threshold value (decision block 80). If so, the comparison metric (and other info such as net name, Steiner length, and current length, as desired) is written to the output file (block 82). If the comparison metric does not exceed the threshold, the comparison metric/net is not written to the output file. Thus, the output file in this embodiment may comprise a list of nets which may be examined for hand routing. Nets which may be less likely to be hand routed may not appear in the list. If each net has not yet been processed, the layout quality analyzer returns to block 60 to process the next net (decision block 84).

Figure 6:
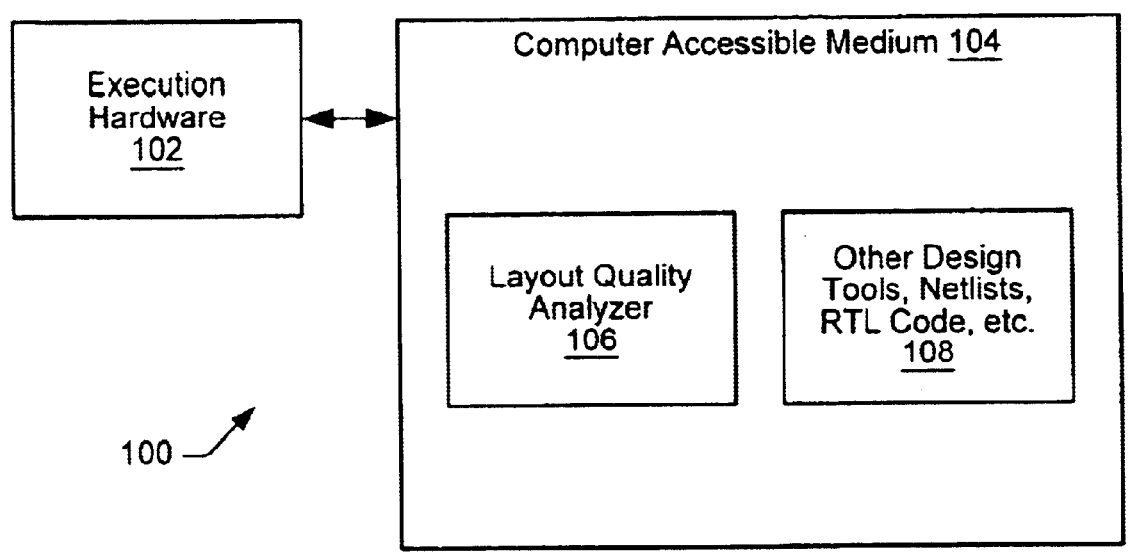
FIG. 6 is a block diagram of one embodiment of a computing system including a computer readable medium carrying the layout quality analyzer.

Turning next to FIG. 6, a block diagram of a computing system 100 is shown. Other embodiments are possible and contemplated. In the embodiment of FIG. 6, the computing system 100 includes execution hardware 102 and a computer accessible medium 104 coupled thereto. The computer accessible medium 104 stores the layout quality analyzer 106, and may include other design tools, netlists, RTL code, etc. (reference numeral 108).

The execution hardware 102 may include any hardware for executing the layout quality analyzer 106. For example, the execution hardware 102 may be a computer system coupled to the computer accessible medium 104 via a network or other external peripheral connection. Alternatively, the execution hardware 102 may comprise one or more processors, memory, and other peripherals incorporated into a computer system which also includes the computer accessible medium 104.

The computer accessible medium 104 may include storage media such as magnetic or optical media, e.g., disk, CD-ROM, or DVD-ROM, volatile or non-volatile memory media such as RAM (e.g. SDRAM, RDRAM, SRAM, etc.), ROM, etc., as well as media accessible via transmission media or signals such as electrical, electromagnetic, or digital signals, conveyed via a communication medium such as a network and/or a wireless link.

Numerous variations and modifications will become apparent to those skilled in the art once the above disclosure is fully appreciated. It is intended that the following claims be interpreted to embrace all such variations and modifications.

What is claimed is:

1. A method comprising:

computing a first plurality of routes, each route of the first plurality of routes corresponding to a respective net of a plurality of nets in an integrated circuit layout, and each route representing a theoretically optimal route of the respective net according to a graph theory based algorithm, but omitting from computing a route for a net if a computation time is to exceed a timeout value; and comparing each of the first plurality of routes not omitted to a corresponding route of a second plurality of routes, each of the second plurality of routes corresponding to the respective net of the plurality of nets, but currently existing in the integrated circuit layout;

identifying one or more routes from the second plurality of routes having a predetermined measurable difference from a corresponding one or more routes from the theoretically optimal routes, the predetermined measurable difference to affect timing delay in the integrated circuit layout.

2. The method as recited in claim 1 wherein the predetermined measurable difference measures connection length.

3. The method as recited in claim 1 wherein the predetermined measurable difference measures capacitance.

4. The method as recited in claim 1 wherein the predetermined measurable difference measures resistance.

5. The method as recited in claim 1 further comprising also omitting from computing one or more nets having a positive timing margin.

6. A computer readable medium comprising:

first instructions which, when executed, compute a first plurality of routes, each route of the first plurality of routes corresponding to a respective net of a plurality of nets in an integrated circuit layout, and each route representing a theoretically optimal route of the respective net according to a graph theory based algorithm, but the first instructions include instructions to omit from computing a route for a net if a computation time is to exceed a timeout value; and second instructions which, when executed, compare each of the first plurality of routes not omitted to a corresponding route of a second plurality of routes, each of the second plurality of routes corresponding to the respective net of the plurality of nets, but currently existing in the integrated circuit layout;

third instructions which, when executed, identify one or more routes from the second plurality of routes having a predetermined measurable difference from a corresponding one or more routes from the theoretically optimal routes, the predetermined measurable difference to affect timing delay in the integrated circuit layout.

7. The computer readable medium as recited in claim 6 wherein the first instructions also omit from computing one or more nets having a positive timing margin.

* * * * *